(12) United States Patent
Moehlmann

(10) Patent No.: US 9,337,850 B2
(45) Date of Patent: May 10, 2016

(54) ALL-DIGITAL PHASE-LOCKED LOOP (ADPLL) WITH REDUCED SETTLING TIME

(71) Applicant: NXP B.V., Eindhoven (NL)

(72) Inventor: Ulrich Moehlmann, Hamburg (DE)

(73) Assignee: NXP, B.V., Eindhoven (NL)

( * ) Notice: Subject to any disclaimer, the term of this patent is extended or adjusted under 35 U.S.C. 154(b) by 58 days.

(21) Appl. No.: 14/446,568

(22) Filed: Jul. 30, 2014

(65) Prior Publication Data

US 2016/0036454 A1 Feb. 4, 2016

(51) Int. Cl.
*H03L 7/06* (2006.01)
*H03L 7/099* (2006.01)

(52) U.S. Cl.
CPC ............ *H03L 7/0994* (2013.01); *H03L 7/0991* (2013.01)

(58) Field of Classification Search
CPC ......... H03L 7/06; H03L 7/099; H03L 7/0991; H03L 7/0994
USPC .............. 327/147, 150, 156, 159; 331/16, 34, 331/36 R, 36 C
See application file for complete search history.

(56) References Cited

U.S. PATENT DOCUMENTS

| 2002/0158696 | A1  | 10/2002 | Staszewski et al. |
|---|---|---|---|
| 2008/0315928 | A1* | 12/2008 | Waheed ............... G04F 10/005 327/159 |
| 2011/0081863 | A1* | 4/2011 | Mendel ................ H03L 7/0991 455/42 |
| 2012/0074993 | A1* | 3/2012 | Chen ........................ H03L 1/00 327/147 |
| 2013/0057327 | A1* | 3/2013 | Ferriss .................. H03L 7/0893 327/156 |
| 2014/0312981 | A1* | 10/2014 | Nakamura ................ H03L 7/02 331/34 |

OTHER PUBLICATIONS

Yan, et al., "A Smart Frequency Presetting Technique for Fast Lock-in LC-PLL Frequency Synthesizer", authorized licensed use limited to: Institute of Semiconductors Cas. Downloaded on Apr. 26, 2010 at 13:45:52 UTC from IEEE Xplore.

* cited by examiner

*Primary Examiner* — William Hernandez

(57) ABSTRACT

Settling time may be reduced or eliminated for a phase-locked loop (ADPLL). An oscillator model provides proper settings that are applied to compensate both the frequency response and the phase response. A hardware device may include a Digital Controlled Oscillator (DCO); and a DCO model device with a processor, wherein the processor is configured to calculate a frequency for the DCO by searching for the frequency based upon operational parameters of the DCO, compare the calculated frequency to a measured frequency, and compensate, based upon the comparison, an ADPLL to decrease a settling time.

20 Claims, 5 Drawing Sheets

ALL-DIGITAL PHASE-LOCKED LOOP (ADPLL) WITH REDUCED SETTLING TIME

TECHNICAL FIELD

Various exemplary embodiments disclosed herein relate generally to all-digital phase-locked loops (ADPLLs) having reduced settling times.

BACKGROUND

Current solutions for ADPLLs may use a time interval to adjust various lock states. During this settling time, disturbances in both phase and frequency may occur. Because of these disturbances, the output signal of the PLL cannot be used during the settling time.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to a non-transitory medium encoded with instructions for execution of a method of reducing a settling time of a Phase Locked Loop (ADPLL), the non-transitory medium including: instructions for_calculating, in a processor, a frequency for a Digital Controlled Oscillator (DCO) by searching for the frequency based upon operational parameters of the DCO; instructions for comparing the calculated frequency to a measured frequency; and instructions for compensating, based upon the comparison, the ADPLL to decrease a settling time.

In various exemplary embodiments, the DCO may be controlled by a plurality of capacitor banks. The plurality of capacitor banks may comprise a Process-Voltage-Temperature (PVT) bank, an Acquisition (ACQ) bank, and a Tracking (TR) bank. There may be instructions for setting a desired frequency between two smallest possible steps of the TR bank. There also may be instructions for setting a threshold for the TR bank; instructions for determining whether the TR bank will exceed the stored threshold; and instructions for exchanging capacitors between banks when the TR bank is about to exceed the stored threshold. There additionally may be instructions for exchanging capacitors between the TR bank and the ACQ bank and instructions for exchanging capacitors between the ACQ bank and the PVT bank. The instructions for calculating may use either binary or linear searching. There further may be instructions for measuring a difference between an ambient temperature and a standard temperature based upon the DCO frequency; instructions for storing the DCO frequency at the standard temperature; and instructions for comparing a DCO frequency at the ambient temperature to the stored DCO frequency.

Further, various exemplary embodiments relate to a hardware device including: a network interface; a memory device; and a processor in communication with the interface memory device, the processor being configured to calculate a frequency for a Digital Controlled Oscillator (DCO) by searching for the frequency based upon operational parameters of the DCO, compare the calculated frequency to a measured frequency, and compensate, based upon the comparison, the ADPLL to decrease a settling time.

In various exemplary embodiments, the DCO may be configured to be controlled by a plurality of capacitor banks. The plurality of capacitor banks may comprise a Process-Voltage-Temperature (PVT) bank, an Acquisition (ACQ) bank, and a Tracking (TR) bank. The processor may be configured to set a desired frequency between two smallest possible steps of the TR bank, set a threshold for the TR bank, determine whether the TR bank will exceed the stored threshold, and, when the TR bank is about to exceed the stored threshold, exchange capacitors between banks. The processor may also be configured to either exchange capacitors between the TR bank and the ACQ bank, or exchange capacitors between the ACQ bank and the PVT bank. The processor may additionally be configured to measure a difference between an ambient temperature and a standard temperature based upon the DCO frequency, store the DCO frequency at the standard temperature, and compare a DCO frequency at the ambient temperature to the stored DCO frequency.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Figure 1:
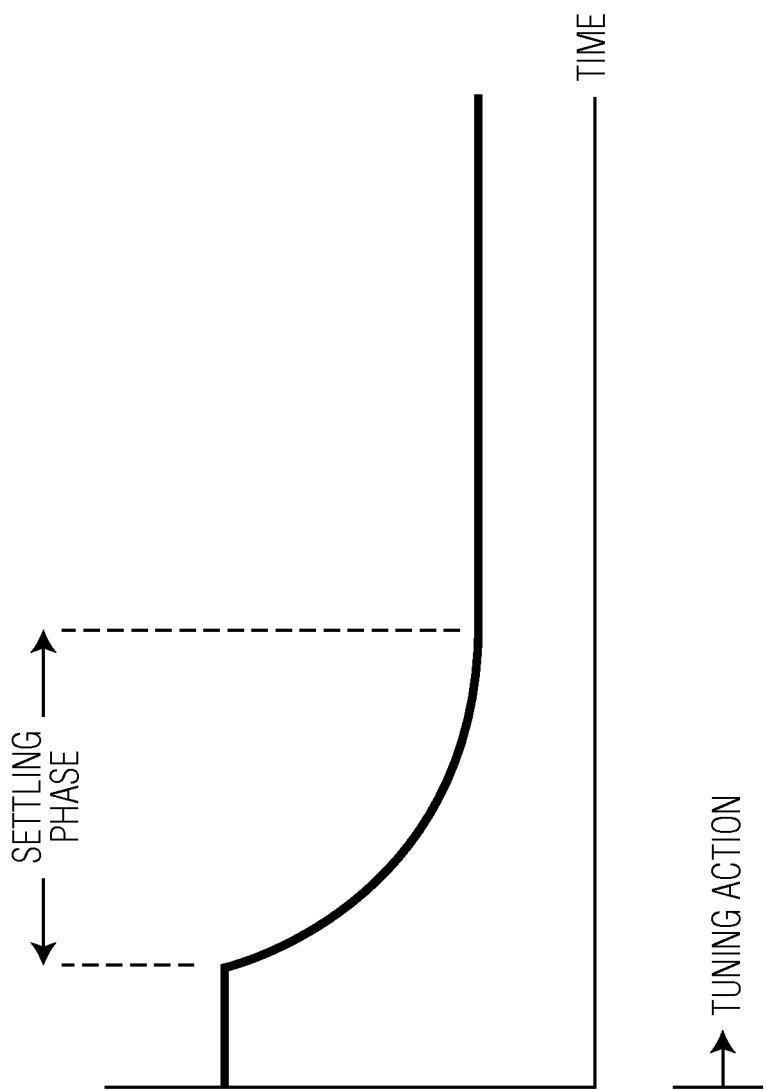
FIG. 1 illustrates a tuning diagram for an ADPLL.

FIG. 1 illustrates a tuning diagram for an ADPLL. The time for locking is on the order of 60 µs. Because of disturbances in phase and frequency during the settling period before locking, the output signal of the ADPLL cannot be used for reception of a radio signal. For an analog PLL, the output of the receiver would be disturbed too much, while for a digital PLL, loss of data will occur. Thus, locking for ADPLLs may be disrupted.

Various exemplary embodiments are described below that may calculate the settling period settings for the ADPLL. Further, an iterative set of calculations may be made based upon the fact that a digitally controlled oscillator (DCO) may have various levels of control resolution.

Figure 2:
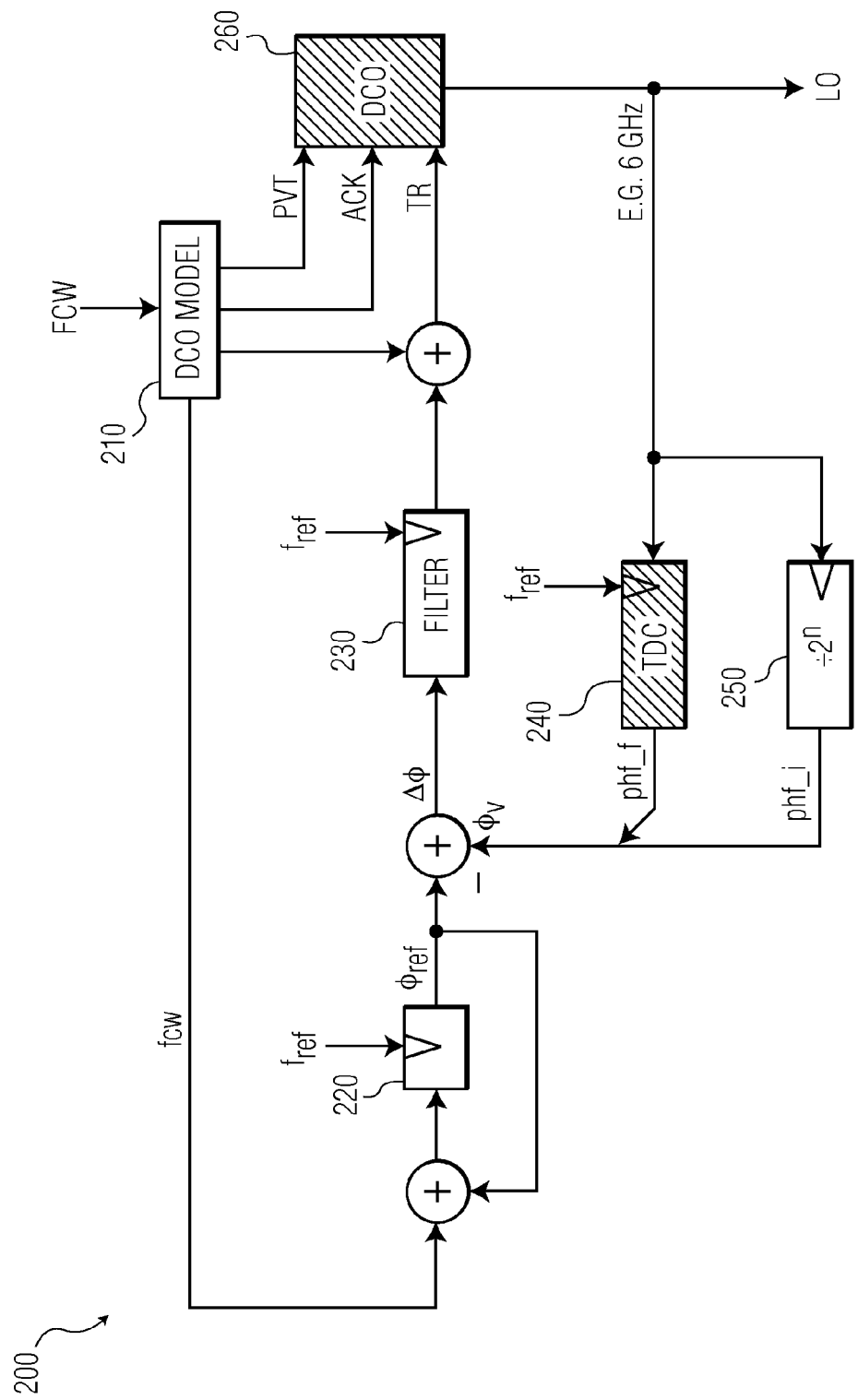
FIG. 2 illustrates a first embodiment of an improved ADPLL.

FIG. 2 illustrates a first embodiment of an improved ADPLL 200. ADPLL 200 includes a digitally-controlled oscillator (DCO) model device 210, a ramp generator 220, a filter 230, a TDC 240, a divider 250, and a DCO 260. These devices are described in further detail below.

The DCO model device 210 receives a Frequency Control Word (FCW) signal as input. Based upon the FCW signal, it produces a Process-Voltage Temperature (PVT) signal and an Acquisition (ACQ) signal. The PVT and ACQ signals are subsequently used for calibration. The DCO model device 210 also forwards a copy of the FCW signal to an adder of ramp generator 220.

The ramp generator 220 receives a combination of the FCW signal from the DCO model device 210 and a feedback phase signal as an input signal. Ramp generator 220 then samples this input signal with reference frequency $f_{ref}$ and, in this way, generates a reference phase, $\phi_{ref}$. The FCW signal may be added to the content of the register each $f_{ref}$ cycle. In particular, ramp generator 220 may generate the reference phase $\phi_{ref}$ by integrating the FCW signal over time.

In an exemplary embodiment, each register may represent a number by a certain number of bits. Application of the FCW signal results in the content of the register increasing in a staircase shape. This value of the register may continue to increase until a maximum representable number, which is defined by the bit-width of the register, is reached. The register then will "flip over". After flipping over, the content of the register is the modulo value of the sum of the register content and the FCW signal, divided by a maximum number defined by the bit width of the register or any other set maximum number lower than the maximum count defined by the bit width of the register.

For example, a ramp may be applied to an adder. The adder then subtracts the feedback phase from the reference phase. Thus, the feedback phase is compared to the input phase. The difference between the reference and feedback phases is the control signal for the loop. A feedback loop then sends the reference phase, $\phi_{ref}$, back to an adder so that it can be combined with the FCW signal to produce the input signal for ramp generator 220.

Filter 230 receives, from an adder, a combination of the reference phase, $\phi_{ref}$, and a feedback signal, $\phi_v$, as an input signal. In the case of linear control, this may be a difference between reference and feedback phases. Other methods might be used to compare the signals. Filter 230 may generate a new TR for the DCO based upon the phase difference during each reference cycle.

The time-to-digital converter (TDC) 240 receives a DCO output signal (LO) from the DCO 260 as input. This received signal may be a local oscillator (LO) signal. The TDC 240 then compares the phase of the input signal to the phase of the reference frequency $f_{ref}$ to produce output $phf_f$. TDC 240 may provide a resolution enhancement of the phase measurement, e.g., by measuring the position of the reference edge within a DCO period.

The divider 250 receives the DCO output signal from the DCO 260 and produces $phf_i$ as output. The combination of $phf_f$ and $phf_i$ results in $\phi_v$.

The DCO 260 receives the PVT and ACQ signals from the DCO model device 210 as input. The DCO 260 receives a TR signal that combines signals from both the DCO model device 210 and the filter 230. The DCO 260 may be an inductive-capacitive (LC) oscillator that is controlled by a plurality of capacitor banks. The capacitor banks may include a PVT bank, an ACQ bank, and a TR bank. Based upon the PVT, ACQ, and TR signals, DCO 260 produces output, which may be the local oscillator (LO) signal.

Figure 3:
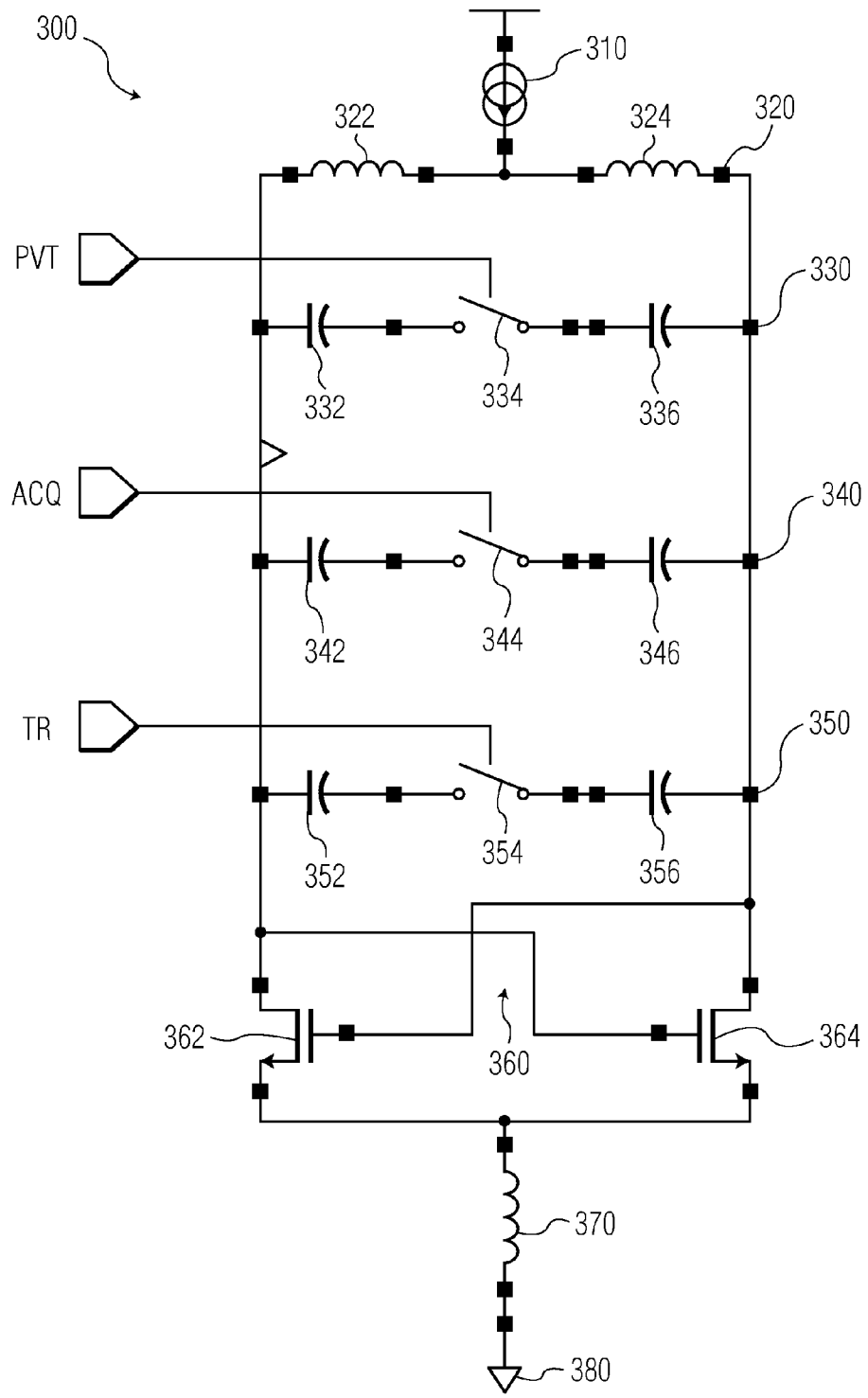
FIG. 3 illustrates an exemplary schematic diagram for a DCO.

FIG. 3 illustrates an exemplary schematic diagram for a DCO 300. The DCO 300 may include a power supply 310, a pair of inductors 320, a PVT capacitor bank 330, an ACQ capacitor bank 340, a TR capacitor bank 350, a pair of transistors 360, an inductor 370, and a ground 380.

A power supply 310 may be coupled between two inductors 322 and 324 of the pair of inductors 320. The opposite ends of inductors 322 and 324 may be coupled to opposing ends of PVT capacitor bank 330, ACQ capacitor bank 340, and TR capacitor bank 350.

A PVT capacitor bank 330 may include a first capacitor bank 332, a switch 334, and a second capacitor bank 336. An input PVT signal may be coupled to switch 334, which may be disposed between first capacitor bank 332 and second capacitor bank 336. Each least significant bit (LSB) in the input PVT signal may correspond to a step within a range of 5 MHz to 10 MHz. Each step may be a 5 fF capacitor. For both first capacitor bank 332 and second capacitor bank 336, switch 334 may select from among multiple inputs of the capacitor banks to allow for various capacitance values based upon the selection.

An ACQ capacitor bank 340 may include a first capacitor 342, a switch 344, and a second capacitor 346. An input ACQ signal may be coupled to switch 344 that is disposed between first capacitor 342 and second capacitor 346. Each LSB in the input ACQ signal may correspond to a step within a range of 500 KHz to 1.2 MHz. Each step may be a 500 aF capacitor. The first capacitor 342 and the second capacitor 346 may also be implemented by a capacitor bank, wherein switch 344 may select from among multiple inputs of the capacitor bank to allow for various capacitance values based upon the selection.

A TR capacitor bank 350 may include a first capacitor 352, a switch 354, and a second capacitor 356. An input TR signal may be coupled to switch 354, which may be disposed between first capacitor 352 and second capacitor 356. Each LSB in the input TR signal may correspond to a step within a range of 15 KHz to 50 KHz. Each step may be a 10 aF capacitor. The first capacitor 352 and the second capacitor 356 may also be implemented by a capacitor bank, wherein switch 354 may select from among multiple inputs of the capacitor bank to allow for various capacitance values based upon the selection.

The pair of transistors 360 may be Field-Effect Transistors (FETs). The FETs 360 may be cross-coupled so that the source of transistor 362 is coupled to the gate of transistor 364 while the source of transistor 364 is coupled to the gate of transistor 362. The drain of transistor 362 may be coupled to the drain of transistor 364. The pair of FETs 360 may represent a gain cell.

Inductor 370 may be coupled to the drains of both transistor 362 and transistor 364. An opposite end of inductor 370 may be coupled to ground 380.

The model that describes the DCO for ideal capacitors can be described by an equation:

$$f_{DCO} = \frac{\left(1 + tempCoeff \cdot \frac{T-T_o}{T_o}\right)^x}{\sqrt{\frac{1}{f_{max}^2} + \left(\frac{1}{f_{pvt,min}^2} - \frac{1}{f_{max}^2}\right) \cdot \frac{pvt}{pvt_{max}} + \left(\frac{1}{f_{acq,min}^2} - \frac{1}{f_{max}^2}\right) \cdot \frac{acq}{acq_{max}} + \left(\frac{1}{f_{tr,min}^2} - \frac{1}{f_{max}^2}\right) \cdot \frac{tr}{tr_{max}}}}$$

The values pvt, acq, and tr are received as described above. Respective frequency values $f_{pvt,min}$, $f_{acq,min}$, and $f_{tr,min}$ are minimum frequencies respectively associated with the PVT, ACQ, and TR capacitor banks. The value $f_{max}$ represents a maximum frequency. The values $pvt_{max}$, $acq_{max}$, and $tr_{max}$ are the maximum values that the variables pvt, acq, and tr may take and are based upon the parameters of the respective PVT, ACQ, and TR capacitor banks. The x in the exponent represents the characteristic of the temperature dependency. In an exemplary embodiment, the capacitors may have a linear dependency from temperature where x=2.

A temperature coefficient, tempCoeff, indicates the sensitivity of the output frequency versus temperatures. There is also a ratio of an ambient temperature T to a reference temperature $T_0$. Based upon all of these parameters, the equation produces a DCO frequency, $f_{DCO}$.

This formula is a good description for the oscillator frequency when the capacitor banks provide good matching properties. If there is mismatch, then the contribution of each capacitor is expressed by the individual frequency change with reference to the maximum frequency. In this case, $pvt_i$, $acq_j$, $tr_k$ are the values of each bit, which may be either one or zero. In this case, the equation is modified as set forth below:

$$f_{DCO} = \frac{\left(1 + tempCoeff \cdot \frac{T-T_o}{T_o}\right)^x}{\sqrt{\frac{1}{f_{max}^2} + \sum_i \left(\frac{1}{f_{pvt,min,i}^2} - \frac{1}{f_{max}^2}\right) \cdot pvt_i + \sum_j \left(\frac{1}{f_{acq,min,j}^2} - \frac{1}{f_{max}^2}\right) \cdot acq_j + \sum_k \left(\frac{1}{f_{tr,min,k}^2} - \frac{1}{f_{max}^2}\right) \cdot tr_k}}$$

This equation may also be expressed by ratios of the terms. In an ideal case the ratio between the terms $$\left(\frac{1}{f_{pvt/acq/tr,min,i}^2} - \frac{1}{f_{max}^2}\right) \text{ and } \left(\frac{1}{f_{pvt/acq/tr,min,i+1}^2} - \frac{1}{f_{max}^2}\right)$$

is 2. It is possible to either calculate the $f_{dco}$ frequency based on capacitor settings or find a configuration of capacitor settings for a certain $f_{dco}$ frequency.

The values for oscillator models may be taken from simulations or measurements. Input signals can represent frequencies from measurements or simulations which express the frequencies in the oscillator models. The representations may be counter states, capacitor values, or other parameters.

The values for $f_{max}$ and $f_{pvt/acq/tr,min}$ may be measured and stored during either a boot phase of the system or during a product test phase. These values may also be simulation results or estimations. The values would subsequently be stored in a non-volatile memory. If measurement is done during the boot phase, there may be a measuring circuit in the system. Otherwise, the measurement may be done outside the system.

During a calculation procedure, a certain $f_{dco}$ is selected so that the desired frequency is between two smallest possible steps of the TR bank. Any search algorithm may be used, such as a binary search algorithm. However, in case of mismatch issues such as large Integral-Non-Linearity (INL), a binary search algorithm may fail, causing the ADPLL system to get out of lock. In such cases, a linear search algorithm may be a safer algorithm.

The search algorithm starts with a coarse bank looking for a setting so that the desired frequency is between two settings of a first bank with the coarsest resolution. It then steps to the next bank with finer resolution and repeats the process. The search may start either at a minimum frequency or a maximum frequency of the DCO, provided that the stepping is done monotonously.

In pseudo-code, the algorithm can be written in the following manner:

```
For pvt=0:pvtmax
  if(fdco(pvt,0,0)>=fdcotarget and fdco(pvt+1,0,0)<=fdcotarget)
    pvtsel=pvt;
    break;
  end
end
For acq=0:acqmax
  if(fdco(pvtsel,acq,0)>=fdcotarget and fdco(pvtsel,acq+1,0)<=fdcotarget)
    acqsel=acq;
    break;
  end
end
For tr=0:trmax
  if(fdco(pvtsel,acqsel,tr)>=fdcotarget and fdco(pvtsel,acqsel,tr+1)<=fdcotarget)
    trsel=tr;
    break;
  end
end
```

Model values for PVT, ACQ, and TR can be calculated by using the $pvt_i, acq_j, tr_k$ values and their respective weights:

$$capbankvalue = \sum_i capbankvalue_i \cdot weight_i$$

The value Capbankvalue=PVT, ACT, or TR, while $weight_i = 2^i$, for example.

The order of bits, MSB or LSB, does not change the calculation.

There may be process dependencies and deviations from the model in the ADPLL system that introduce errors. Compensating for such errors may require a second phase that functions as a learning phase. In this learning phase, differences between the value after settling of the system and the calculated value are stored. It may not necessary to store these differences for all frequencies. In lieu of storing all differences, the calculations may be done in large frequency intervals. Interpolation would be used to estimate the differences for frequencies between these intervals. In an ideal case, no correction would be necessary.

Model values may be compensated to reflect a temperature offset between the ADPLL system at a reference temperature for the frequency at which the model values were determined and the actual temperature. Such compensation may be more accurate if a dependency between temperature and frequency is not expressed as a linear relationship. A second, third, or higher order polynomial function or another suitable approximation may be used.

The implementation of the model may involve either a hardcoded design or a piece of software in a microprocessor. To ease implementation, it may be possible to use approximations like a Taylor series for the model.

To further stabilize the device, the phase error of the phase detector and the TR value of the loop filter should be initially set to a neutral value. This neutral value may zero. This setting will discharge the loop filter, so that the loop only gets rid of a small phase or frequency offset. This may be done by the loop filter, which only has a TR bank output, thereby providing a difference between the calculated value and the necessary value.

The model may also compensate for temperature drift of the ADPLL system. Capacitors may be exchanged between the TR bank and the ACQ bank if the TR bank is about to exceed a critical limit. If the temperature dependency of the oscillator is sufficiently large, the ACQ bank might also exceed a threshold. In that case, capacitors may be exchanged between the ACQ bank and the PVT bank. If the temperature of the system is known, new settings can be generated by the model and immediately applied.

The model may also be used to sense temperatures. If the process spread is negligible and the frequency is only influenced by temperature, the model may measure the difference between the temperature at which the DCO was characterized and the actual temperature.

For an analog PLL system, this method may be used for varactor tuning. In this case, tuning voltages may be added to the model in addition to the capacitor bank settings. The model may compensate for the accuracy of the tuning voltages.

Figure 4:
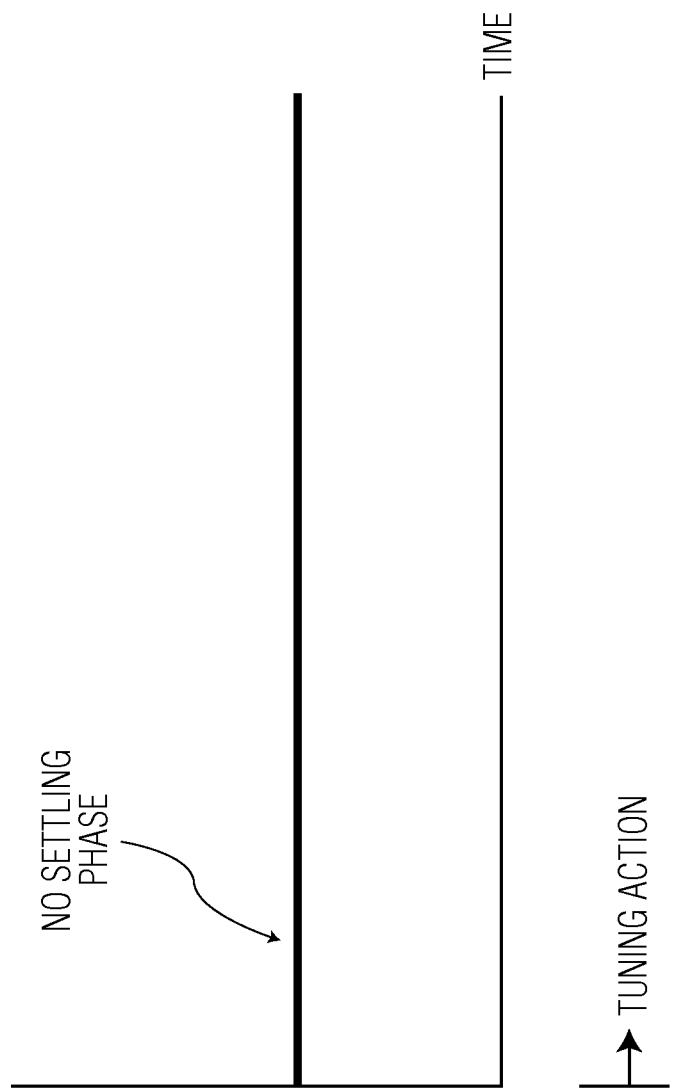
FIG. 4 illustrates an improved tuning diagram for a ADPLL.

FIG. 4 illustrates an improved tuning diagram for a ADPLL. Unlike the prior art tuning diagram illustrated in FIG. 1, locking of the ADPLL may occur without any settling phase in FIG. 4.

Figure 5:
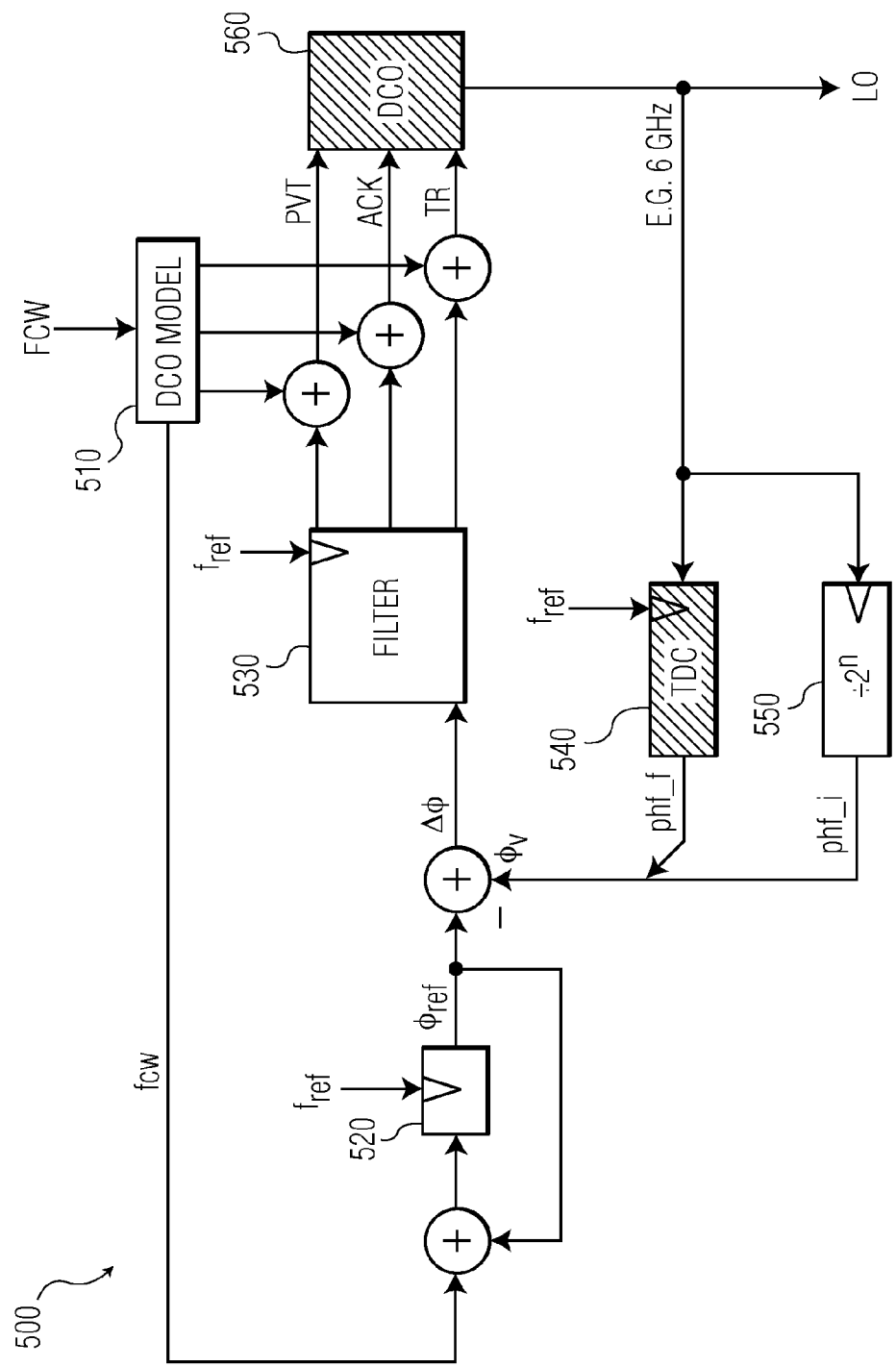
FIG. 5 illustrates a second embodiment of an improved ADPLL.

FIG. 5 illustrates a second embodiment of an improved ADPLL 500.

ADPLL 500 includes a digitally-controlled oscillator (DCO) model device 510, a ramp generator 520, a filter 530, a TDC 540, a divider 550, and a DCO 560. These units are described in further detail below.

The DCO model device 510 receives a Frequency Control Word (FCW) signal as input. Based upon the received FCW signal, it produces PVT, ACQ, and TR calibration signals. The DCO model device 510 also forwards a copy of the FCW signal to an adder of the frequency to phase converter 520. The DCO model device 510 may be implemented using a processor running instructions.

The ramp generator 520 receives a combination of the FCW signal from the DCO model device 510 and a feedback phase signal as an input signal. Ramp generator 520 then samples this input signal with reference frequency $f_{ref}$ and, in this way, generates a reference phase, $\phi_{ref}$. In particular, ramp generator 520 may generate the reference phase $\phi_{ref}$ by integrating the FCW signal over time. This happens by adding the FCW signal to the content of the register during each $f_{ref}$ cycle.

Filter 530 receives, at an adder, a combination of the reference phase, $\phi_{ref}$, and a feedback signal, $\phi_v$, as an input signal. It compares this input signal to the reference frequency $f_{ref}$ to produce PVT, ACQ, and TR signals as output.

The time-to-digital converter (TDC) 540 receives a signal from the DCO 260 as input. This received signal may be a local oscillator (LO) signal. It then compares this input signal to the reference frequency $f_{ref}$ to produce output $phf_f$.

The divider 550 receives the LO signal from the DCO 260 as input and produces $phf_i$ as output. The combination of $phf_f$ and $phf_i$ results in $\phi_v$.

The DCO 560 receives PVT, ACQ, and TR signals that combine the PVT, ACQ, and TR signals from filter 530 with the PVT, ACQ, and TR signals from DCO model device 510. DCO 560 is an inductive-capacitive (LC) oscillator that is controlled by a plurality of capacitor banks. The capacitor banks may include a PVT bank, an ACQ bank, and a TR bank. Based upon the PVT, ACQ, and TR signals, DCO 560 produces the LO signal as output. The DCO 560 may operate like the DCO 300 depicted in FIG. 3

In this embodiment, the filter compensates for differences between calculated and optimal values of the PVT, ACQ, and TR capacitor banks. Both the phase error and the loop filter content may be reset to zero, thereby providing a discharge function when applying the estimated values for each bank The accuracy of this method may be improved during operation by a learning procedure. If previously used values are stored in the model for subsequent use, the lock time can be reduced to zero. This method may also be improved by interpolation between known values. If the mismatch properties of the PVT, ACQ, and TR banks are known, calibration signals may also compensate for the known mismatches.

When switching between a certain number of known frequencies, e.g., two known frequencies, a settling time will be used only once for determination of each setting. The determined settings may then be stored. The stored settings may subsequently be used to tune between these frequencies, eliminating any additional settling time.

It should be noted that various aspects of the above embodiments may be combined resulting in other embodiments. Also, various steps in the methods may be performed in a different order or simultaneously. Also various aspects of the embodiments above may be implemented using processors and computer instructions to result in a specific machine implementing the embodiment. Also, portions of the embodiments above may be implemented using ASICs or other specific hardware elements.

As used herein, the term "processor" will be understood to encompass a variety of devices such as microprocessors, field-programmable gate arrays (FPGAs), application-specific integrated circuits (ASICs), and other similar processing and computing devices.

Other embodiments that use wireless power capabilities between a transaction terminal and mobile device powered by the wireless power in order to complete a transaction are envisioned.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A non-transitory medium encoded with instructions for execution of a method of reducing a settling time of an All Digital Phase Locked Loop (ADPLL), the non-transitory medium comprising:
instructions for calculating, in a processor, a frequency for a Digital Controlled Oscillator (DCO) by searching for the frequency based upon operational parameters of the DCO;
instructions for comparing the calculated frequency to a measured frequency; and
instructions for compensating, based upon the comparison, the ADPLL to decrease a settling time.

2. The non-transitory medium of claim 1, wherein the DCO is controlled by a plurality of capacitor banks.

3. The non-transitory medium of claim 2, wherein the plurality of capacitor banks comprise a Process-Voltage-Temperature (PVT) bank, an Acquisition (ACQ) bank, and a Tracking (TR) bank.

4. The non-transitory medium of claim 3, further comprising:
instructions for setting a desired frequency between two smallest possible steps of the TR bank.

5. The non-transitory medium of claim 3, further comprising:
instructions for setting a threshold for the TR bank;
instructions for determining whether the TR bank will exceed the stored threshold; and
instructions for exchanging capacitors between banks when the TR bank is about to exceed the stored threshold.

6. The non-transitory medium of claim 5, further comprising:
instructions for exchanging capacitors between the TR bank and the ACQ bank.

7. The non-transitory medium of claim 5, further comprising:
instructions for exchanging capacitors between the ACQ bank and the PVT bank.

8. The non-transitory medium of claim 1, wherein the instructions for calculating use binary searching.

9. The non-transitory medium of claim 1, wherein the instructions for calculating use linear searching.

10. The non-transitory medium of claim 1, further comprising:
instructions for measuring a difference between an ambient temperature and a standard temperature based upon the DCO frequency.

11. The non-transitory medium of claim 10, further comprising;
instructions for storing the DCO frequency at the standard temperature; and
instructions for comparing a DCO frequency at the ambient temperature to the stored DCO frequency.

12. A hardware device comprising;
a Digital Controlled Oscillator (DCO); and
a DCO model device further comprising a processor, wherein the processor is configured to calculate a frequency for the DCO by searching for the frequency based upon operational parameters of the DCO, compare the calculated frequency to a measured frequency, and compensate, based upon the comparison, an All Digital Phase Locked Loop (ADPLL) to decrease a settling time.

13. The hardware device of claim 12, wherein the DCO is configured to be controlled by a plurality of capacitor banks.

14. The hardware device of claim 13, wherein the plurality of capacitor banks comprise a Process-Voltage-Temperature (PVT) bank, an Acquisition (ACQ) bank, and a Tracking (TR) bank.

15. The hardware device of claim 14, wherein the processor is configured to set a desired frequency between two smallest possible steps of the TR bank.

16. The hardware device of claim 14, wherein the processor is configured to set a threshold for the TR bank, determine whether the TR bank will exceed the stored threshold, and, when the TR bank is about to exceed the stored threshold, exchange capacitors between banks.

17. The hardware device of claim 16, wherein the processor is configured to exchange capacitors between the TR bank and the ACQ bank.

18. The hardware device of claim 16, wherein the processor is configured to exchange capacitors between the ACQ bank and the PVT bank.

19. The hardware device of claim 12, wherein the processor is configured to measure a difference between an ambient temperature and a standard temperature based upon the DCO frequency.

20. The hardware device of claim 19, wherein the processor is configured to store the DCO frequency at the standard temperature and compare a DCO frequency at the ambient temperature to the stored DCO frequency.

* * * * *